United States Patent [19]
Laxman et al.

[11] Patent Number: 5,874,368
[45] Date of Patent: Feb. 23, 1999

[54] SILICON NITRIDE FROM BIS (TERTIARYBUTYLAMINO)SILANE

[75] Inventors: Ravi Kumar Laxman, Encinitas; David Allen Roberts, Escondido; Arthur Kenneth Hochberg, Solana Beach; Herman Gene Hockenhull, Oceanside; Felicia Diane Kaminsky, Encinitas, all of Calif.

[73] Assignee: Air Products and Chemicals, Inc., Allentown, Pa.

[21] Appl. No.: 942,996

[22] Filed: Oct. 2, 1997

[51] Int. Cl.⁶ .................................................. H01L 21/318
[52] U.S. Cl. ......................... 438/794; 427/99; 427/255.2
[58] Field of Search ..................... 438/794, 791; 427/255, 255.2, 255.1, 248.1, 99; 148/DIG. 114

[56] References Cited

U.S. PATENT DOCUMENTS

| | | | |
|---|---|---|---|
| 3,574,677 | 4/1971 | Pammer et al. | 117/201 |
| 4,777,205 | 10/1988 | La Scola et al. | 524/440 |
| 4,992,299 | 2/1991 | Hochberg et al. | 427/255.1 |
| 5,234,869 | 8/1993 | Mikata et al. | 437/241 |
| 5,486,589 | 1/1996 | Inoue | 528/17 |

FOREIGN PATENT DOCUMENTS 6-132284  5/1994  Japan .

OTHER PUBLICATIONS

Semiconductor and Process technology handbook, edited by Gary E. McGuire, Noyes Publication, New Jersey, (1988), pp. 289–301.

Silicon Processing for the VLSI Era, Wolf, Stanley, and Talbert, Richard N., Lattice Press, Sunset Beach, California (1990), pp. 20–22, 327–330.

Sorita et al., J. Electro. Chem. Soc., vol. 141, No. 12, (1994), pp. 3505–3511.

B. A. Scott, J. M. Martinez–Duart, D. B. Beach, T. N. Nguyen, R. D. Estes and R. G. Schad., Chemtronics, 1989, vol. 4, pp. 230–234.

J. M. Grow, R. A. Levy, X. Fan and M. Bhaskaran, Materials Letters, 23, (1995), pp. 187–193.

A. K. Hochberg and D. L. O'Meara, Mat. Res. Soc. Symp. Proc., vol. 204, (1991), pp. 509–514.

R. G. Gordon and D. M. Hoffman, Chem. Mater., vol. 2, (1990), pp. 482–484.

Primary Examiner—Charles Bowers
Assistant Examiner—Matthew Whipple
Attorney, Agent, or Firm—Geoffrey L. Chase

[57] ABSTRACT

A process for the low pressure chemical vapor deposition of silicon nitride from ammonia and a silane of the formula: $(t-C_4H_9NH)_2SiH_2$ provides improved properties of the resulting film for use in the semiconductor industry.

8 Claims, No Drawings

SILICON NITRIDE FROM BIS (TERTIARYBUTYLAMINO)SILANE

BACKGROUND OF THE INVENTION

The present invention is directed to the field of low pressure chemical vapor deposition of silicon nitride films using bis(tertiarybutylamino)silane, a novel organosilicon source material for silicon nitride.

In the fabrication of semiconductor devices, a thin passive layer of a chemically inert dielectric material such as, silicon nitride ($Si_3N_4$) is essential. Thin layers of silicon nitride function as diffusion masks, oxidation barriers, trench isolation, intermetallic dielectric material with high dielectric breakdown voltages and passivation layers. Many other applications of silicon nitride coatings in the fabrication of semiconductor devices are reported elsewhere, see Semiconductor and Process technology handbook, edited by Gary E. McGuire, Noyes Publication, New Jersey, (1988), pp 289–301; and Silicon Processing for the VLSI ERA, Wolf, Stanley, and Talbert, Richard N., Lattice Press, Sunset Beach, Calif. (1990), pp 20–22, 327–330.

The present semiconductor industry standard silicon nitride growth method is by low pressure chemical vapor deposition in a hot wall reactor at >750° C. using dichlorosilane and ammonia.

Deposition of silicon nitride over large numbers of silicon wafers has been accomplished using many precursors. The low pressure chemical vapor deposition (LPCVD) using dichlorosilane and ammonia requires deposition temperatures greater than 750° C. to obtain reasonable growth rates and uniformities. Higher deposition temperatures are typically employed to get the best film properties. There are several drawbacks in these processes and some of these are as follows:

i) Deposition under 850° C. gives poor hazy films with chlorine and particle contamination;

ii) Silane and dichlorosilane are pyrophoric, toxic compressed gases;

iii) Films formed from dichlorosilane result in the formation of less uniform films; and iv) Films from dichlorosilane have contaminants, such as chlorine and ammonium chloride, which are formed as byproducts.

Japanese Patent 6-132284 describes deposition of silicon nitride using organosilanes with a general formula $(R_1R_2N)_n SiH_{4-n}$ (where $R_1$ and $R_2$ range from H—, $CH_3$—, $C_2H_5$—, $C_3H_7$—, $C_4H_9$—) by a plasma enhanced chemical vapor deposition and thermal chemical vapor deposition in the presence of ammonia or nitrogen. The precursors described here are tertiary amines and do not contain NH bonding as in the case of the present invention. The deposition experiments were carried out in a single wafer reactor at 400° C. at high pressures of 80–100 Torr. The Si:N ratios in these films were 0.9 (Si:N ratios in $Si_3N_4$ films is 0.75) with hydrogen content in the deposited films. The butyl radical is in the form of isobutyl.

Sorita et al., J. Electro. Chem. Soc., Vol 141, No 12, (1994), pp 3505–3511, describe deposition of silicon nitride using dichlorosilane and ammonia using a LPCVD process. The major products in this process are aminochlorosilane, silicon nitride and ammonium chloride. Formation of ammonium chloride is a major drawback of using Si—Cl containing precursors. The formation of ammonium chloride leads to particle formation and deposition of ammonium chloride at the backend of the tube and in the plumbing lines and the pumping system. Processes which contain chlorine in the precursors result in $NH_4Cl$ formation. These processes require frequent cleaning and result in large down time of the reactors.

B. A. Scott, J. M. Martnez-Duart, D. B. Beach, T. N. Nguyen, R. D. Estes and R. G. Schad., Chemtronics, 1989, Vol 4, pp 230–234., report deposition of silicon nitride using silane and ammonia by LPCVD in the temperature region of 250°–400° C. Silane is a pyrophoric gas and is difficult to control for the deposition of clean silicon nitride due to partial gas phase reaction.

J. M. Grow, R. A. Levy, X. Fan and M. Bhaskaran, Materials Letters, 23, (1995), pp 187–193, describe deposition of silicon nitride using ditertiarybutylsilane and ammonia by LPCVD process in the temperature range of 600°–700° C. The deposited silicon nitride films were contaminated with carbon impurities (10 atomic %). This is mainly due to the presence of direct Si—C bonds in the precursor.

A. K. Hochberg and D. L. O'Meara, Mat. Res. Soc. Symp. Proc,. Vol. 204, (1991), pp 509–514, report deposition of silicon nitride and silicon oxynitride by using diethylsilane with ammonia and nitric oxide by LPCVD. The deposition was carried out in the temperature range of 650° C. to 700° C. The deposition is limited to deposition at 650° C. and the deposition rate drops to below 4 Å/min at lower temperatures. In the LPCVD process, precursors which contain direct Si—C carbon bonds result in carbon contamination in the films. Carbon free deposition requires greater than 5:1 $NH_3$ to precursor ratios. At lower ammonia concentrations, the films were found to contain carbon. Diethylsilane+ammonia processes typically require covered boats or temperature ramping to improve uniformities across the wafers.

U.S. Pat. No. 5,234,869 and R. G. Gordon and D. M. Hoffman, Chem. Mater., Vol. 2, (1990), pp 482–484 disclose other attempts to reduce the amount of carbon involved aminosilanes, such as tetrakis(dimethylamino)silane. The temperature of deposition is in the range of 300°–1000° C. with pressures in the range of 1 mTorr–10 Torr. The presence of direct Si—N bonds and the absence of Si—C bonds were expected to give lower carbon concentrations in the films. However, there are three main disadvantages with precursors of this class.

1) They contain N-methyl groups, the methyl groups tend to migrate to the silicon surface readily and contaminate the films with carbon during a CVD process. In order to reduce the amount of carbon, the process involves high temperatures (>700) and high ammonia ratios (>10:1). With increased ammonia ratios the deposition rates dramatically reduce due to reactant depletion.

2) They do not contain NH bonding and they do not involve secondary silanes.

3) At lower temperatures the deposition rates and uniformities are very poor (>5%).

The prior art has attempted to produce silicon nitride films at low temperatures, at high deposition rates and low hydrogen and carbon contamination. However, the prior art has not been successful in achieving all these goals simultaneously with one silicon precursor. The present invention has overcome the problems of the prior art with the use of a precursor unique to the formation of silicon nitride which avoids the problems of plasma deposition, operates at low thermal conditions, avoids Si—C bonds to reduce carbon contamination of the resulting films, has low hydrogen contamination, as well as avoiding chlorine contamination and operates at low pressures (20 mTorr–2 Torr) in a manufacturable batch furnace (100 wafers or more), as will be described in greater detail below.

BRIEF SUMMARY OF THE INVENTION

The present invention is a process for the low pressure chemical vapor deposition of silicon nitride on a substrate using ammonia and a silane of the formula:

Preferably, the temperature of the substrate is in the range of approximately 500° to 800° C.

Preferably, the pressure is in the range of approximately 20 mTorr to 2 Torr.

Preferably, the molar ratio of ammonia to silane is greater than approximately 2:1.

Preferably, the substrate is silicon.

Preferably, the substrate is an electronic device.

Alternatively, the substrate is a flat panel display.

In a preferred embodiment the present invention is a low temperature chemical vapor deposition of silicon nitride in a reaction zone, comprising the steps of:

a) heating a substrate to a temperature in the range of approximately 500°–800° C. in said zone;

b) maintaining the substrate in a vacuum at a pressure in the range of approximately 20 mTorr–2 Torr in said zone;

c) introducing into said zone ammonia and a silane of the formula: $(t\text{-}C_4H_9NH)_2SiH_2$; and d) maintaining the conditions of a) through c) sufficient to cause a film of silicon nitride to deposit on the substrate.

BRIEF DESCRIPTION OF SEVERAL VIEWS OF THE DRAWINGS

Not Applicable

DETAILED DESCRIPTION OF THE INVENTION

A large variety of "thin films" are used in the fabrication of Very Large Scale Integration (VLSI) devices. These deposited thin films can be of metals, semiconductors, or insulators. The films may be thermally grown or deposited from the vapor phase using LPCVD). VLSI technology requires very thin insulators for a variety of applications in both microprocessors and random-access memories device fabrication. Silicon dioxide has been predominantly used as a dielectric material because of its ease of deposition and excellent properties at the $SiO_2/Si$ interface. Silicon nitride has other advantages over silicon dioxide, some of these include impurity and dopant resistant diffusion barriers, high dielectric breakdown voltages, superior mechanical and inherent inertness of $Si_3N_4$.

In VLSI fabrication a large set of rigorous chemical, structural, process and electrical requirements need to be satisfied. Purity of the film, thickness, uniformity and deposition rates are some of the strictly controlled parameters to facilitate fabrication of submicron features in a device. It is a major advantage in the fabrication and performance of a device if the deposition process can be carried out at temperatures lower than 850° C. Silicon source materials for depositing silicon nitride under LPCVD conditions at these temperatures are limited to silane and dichlorosilane. A safe, reliable low temperature silicon nitride source material has applications in other technologies, such as; flat panel display devices, other electronic and non-electronic substrates or compound semiconductor device fabrication.

The present invention is directed to bis (tertiarybutylamino)silanes as a class of aminosilanes that deposit silicon nitride at unexpectedly low temperatures with superior uniformities.

The bis(tertiarybutylamino)silane meets the following formula:

The deposited films have superior uniformities and are free of ammonium chloride and chlorine contamination. The bis(tertiarybutylamino)silane apparently has the property to deposit silicon nitride at 250°–300° C. below that of the dichlorosilane+ammonia process by LPCVD. Analogous aminosilanes which contain ligands, such as n-butylamines and tetrakis(dimethylamino)silane, do not deposit carbon free films at such low temperatures by LPCVD, and the film uniformities are poorer.

The remarkable advantages of bis(tertiarybutylamino) silane may be attributable to the inherent property of t-butyl amine ligands in bis(tertiarybutylamino)silane. During pyrolysis of bis(tertiarybutylamino)silane, the t-butyl amine ligand may eliminate readily as isobutylene. Isobutylene is a very stable, good leaving group and thus does not contaminate silicon nitride films during deposition. In comparison to the dialkylaminosilanes, tertiarybutylamino groups are more basic than dialkylamines due to the presence of the nitrogen-hydrogen bond (N—H) in the tertiarybutylamino group. The presence of the N—H bond may facilitate labile β-hydride transfer to form diaminosilane and cleavage of the tertiarybutyl group as isobutylene.

Other advantages of bis(tertiarybutylamino)silane can be summarized as follows:

1) It is a non-pyrophoric volatile stable liquid with a vapor pressure of 7.5 Torr at 40°–45° C.

2) It does not have any chlorine in the precursor. The Si—Cl bonds in dichlorosilane leads to the formation of ammonium chloride which deposits in the back end of the tube and requires frequent cleaning.

3) The precursor does not contain direct Si—C bonds, and the resulting silicon nitride films were carbon free, as indicated by auger spectroscopy.

4) The t-butyl amino ligands behave as good leaving groups to form isobutylene and are readily eliminated during pyrolysis. This is thought to be in part because the compound has a N—H bond. This additional advantage helps in removing all the carbon cleanly without contaminating the deposited films.

5) When compared to the dichlorosilane and ammonia process bis(tertiarybutylamino)silane gives superior uniformities. This may be due to the presence of bulky t-butyl amino ligand. The steric bulk of these ligands helps in increased mobility of the molecules on the surface of the substrate which results in higher uniformity.

6) When compared to other amines, such as; diamino, dimethylamino and other alkylamines, the deposition temperature using these precursors can be lower by 250°–300° C.

A comparison of other precursor deposition temperatures, precursor and film properties are given in Table 1

TABLE 1

| Precursors | Vapor Pressure (Torr @ °C.) | Deposition Temp. (°C.) | Precursor and Film Properties |
|---|---|---|---|
| SiH$_4$ + NH$_3$ | Gas at ambient | 200–400 Plasma process | Pyrophoric gas. Gas phase reaction. Silicon rich at lower temperatures. Films may contain hydrogen. |
| Cl$_2$SiH$_2$ + NH$_3$ | Gas at ambient | >750 | Corrosive gas. Direct Si—Cl bonds. Chlorine contamination. Ammonium chloride as byproduct. |
| (C$_2$H$_5$)$_2$SiH$_2$ + NH$_3$ | 100 at 20 | 650–725 | Poor uniformities. Direct Si—C bonds. Direct Si-Cl bonds. Carbon impurities in the films >2%. May require cage boats and temperature ramping. |
| (t-C$_4$H$_9$)$_2$SiH$_2$ + NH$_3$ | 20.5 at 20 | 600–700 | Direct Si—C bonds. Carbon content (10 at %) in the films. |
| [(CH$_3$)$_2$N]$_3$SiR + NH$_3$ R=H or CH3 | 16 at 25 | 700–1000 | Direct Si—C bonds. Carbon content in the films >2% and require high ammonia to source ratios (30:1). Poor uniformities of >5%. |
| (t-C$_4$H$_9$NH)$_2$SiH$_2$ (present invention) | 7.5 at 45 | 500–1000 | No Si—C bonds, no carbon contamination, good uniformity and high deposition rate. |
| (t-C$_4$H$_9$)$_2$Si(NH$_2$)$_2$ + NH$_3$ | 2.1 at 39 | 600–700 | Direct Si—C bonds. Carbon contamination in the films. |

The bis(tertiarybutylamino)silane compound is also more desirable than ditertiarybutylamino analog for the N—H bonding properties discussed above, and bis (tertiarybutylamino)silane is more desirable than the mono, tri or tetrakis (tertiarybutylamino) analog because the mono analog is unstable, the tri substituted analog has significant delivery problems, the tetrakis (tertiary butylamino)silane analog has much lower vapor pressure and cannot be readily synthesized due to steric bulk of the ligands on a single silicon atom and therefore, inappropriate for commercial use.

To form silicon nitride films, the bis(tertiarybutylamino) silane and ammonia are allowed to react in the reactor tube at an elevated temperature (preferably 500° C.–800° C., but the temperature could be less or greater than this range). Reaction may occur either on the surface or very close to the wafer surface to deposit a thin silicon nitride film. If the reaction occurs in the gas phase (a homogeneous reaction) then clusters of silicon nitride are formed. Such cases are typical in silane and ammonia process. When the reaction occurs close to the wafer surface then the resulting films are of superior uniformities. Thus, one important requirement for CVD application is the degree to which heterogeneous reactions are favored over gas phase reactions.

The CVD process can be grouped into a) a gas-phase process and b) a surface reaction process. The gas phase phenomenon is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas and concentration gradient across the boundary layer. Several surface processes can be important when the gases reach the hot surface, but the surface reaction, in general, can be modeled by a thermally activated phenomenon which proceeds at a rate which is a function of the frequency factor, the activation energy, and the temperature.

The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport. This is referred to as a mass-transport limited deposition process. At lower temperatures, the surface reaction rate is reduced, and eventually the concentration of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes, the temperature at which the deposition condition moves from one of these growth regimes to the other is dependent on the activation energy of the reaction, and the gas flow conditions in the reactor. Thus, it is difficult to extrapolate process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This, in turn, implies that a constant temperature must exist everywhere on all wafer surfaces. On the other hand, under such conditions, the rate at which reactants reach the surface is not important, since their concentration does not limit the growth rate. Thus, it is not as critical that a reactor be designed to supply an equal flux of reactants to all locations of a wafer surface. It should be appreciated that in LPCVD reactors, wafers can be stacked vertically and at very close spacing because such systems operate in a reaction rate limited mode. The reason for this is as follows: Under the low pressure of an LPCVD reactor ~1 torr, the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and byproducts away from the substrate surface, and the rate-limiting step is thus the surface reaction.

The presence of the tertiary-butyl group in bis (tertiarybutylamino)silane apparently helps the surface reaction pathways and hence the deposited films have a superior uniformity when compared to other processes, even at lower temperatures. These films were deposited using an LPCVD hot walled reactor, as described below.

Low pressure chemical vapor deposition processes (LPCVD) involve chemical reactions that are allowed to take place in the pressure range of 20 mTorr to 2 Torr. The chemical vapor deposition (CVD) process can be described in the following sequence of steps at a given temperature, pressure and ratio of the reactants:

1) Reactants are introduced into the reaction chamber and may be diluted with inert gases, if needed;
2) The reactants are allowed to diffuse to the substrate;
3) The reactants are adsorbed on the substrate, and the adsorbed molecules undergo migration; and
4) Chemical reactions occur on the surface, and the gaseous byproducts of the reaction are desorbed, leaving behind the deposited film. The reactions are initiated by several methods; e.g., thermal or photons. Thermal energy is used in the LPCVD process.

Horizontal tube hot wall reactors are the most widely used for LPCVD in VLSI manufacturing. They are employed for depositing poly-Si, silicon nitride, undoped and doped silicon dioxide films. These reactors are used extensively because they are economical, have high throughputs, their deposited films are uniform and they can accommodate large diameter wafers (6"–12"). Their main disadvantages are susceptibility to particulate contamination and low deposition rates.

The vertical flow isothermal LPCVD reactor may also be used for deposition of silicon dioxide. Here, the reactor configuration can avoid the wafer-to-wafer reactant depletion effects. They require no temperature ramping, produce highly uniform depositions and reportedly achieve low particulate contamination.

To induce the low pressure conditions in the reactor, an appropriate vacuum system is necessary. For the present experiments, the vacuum system consisted of a rotary vane pump/roots blower combination and various cold traps. The reactor pressure is controlled by a capacitance manometer feedback to a throttle valve controller. Reactor loading consisted of eighty 100 mm diameter silicon wafers at 9 mm spacing in standard diffusion boats. The boats were positioned on a sled, so that the wafers centers were slightly above the center of the reaction tube. This produces a uniform conductance around the wafer peripheries by compensating for conductance restrictions caused by the boats and the sled. The temperature uniformity across the wafer load for the data presented was ±1° C. as measured by an internal multi-junction thermocouple. Deposition uniformity down the wafer load is improved by a temperature ramp.

Our deposition experiments were carried out in a horizontal tube reactor, but the deposition with this precursor will occur even in a vertical tube reactor. The precursor was fed through an open port near the load door. Ammonia was also fed from a port near the door of the furnace separately.

The present invention of a method of depositing substantially pure thin silicon nitride films on silicon wafers by using a bis(tertiarybutylamino)silane precursor has been demonstrated experimentally. The bis(tertiarybutylamino) silane is a non-pyrophoric volatile liquid which is safer to handle than silane and dichlorosilane. The deposition process is carried out at preferably 20 mTorr–2 Torr in the temperature range of preferably 500° C. to 800° C. using vapors from bis(tertiarybutylamino)silane and ammonia.

Optionally, an inert gas diluent, such as nitrogen or argon, can be used to dilute and control the rate of reaction. The molar feed ratio of ammonia to bis(tertiarybutylamino) silane and ammonia is preferably greater than 2:1.

EXAMPLE 1

The process involves reaction of bis(tertiarybutylamino) silane with ammonia under LPCVD conditions (low pressure range of 20 mTorr–2 Torr). The precursor and ammonia are introduced into the heated reactor (500°–800° C.) via injectors placed at the door. The reactants are flowed over wafers into the evacuated chamber. The ammonia to silicon source is kept at a ratio in the range of 2:1–10:1. A continuous film of silicon nitride is deposited upon the surface of a silicon wafer. These films are suitable for integrated circuit manufacture. A typical run was carried out in a 150 mm hot wall LPCVD horizontal tube reactor, although the apparatus configuration is not critical. The process involves loading the quartz reactor with 75 to 100 silicon wafers; evacuating the system; letting the wafers come to a desired temperature at which the deposition will be carried out. The energy required for this reaction can be supplied by simple resistive heating. However, simple, resistive heating is advantageous because the equipment is less expensive, and one avoids radiative film damage often associated with plasma reactors.

The films are characterized by infrared spectroscopy and refractive index. FT-IR spectrum is consistent with silicon nitride films deposited from other known nitride precursors e.g. dichlorosilane+ammonia. There are moderate absorption bands in the Si—H stretching region at 2100 cm$^{-1}$ and a strong Si—N stretch at 834 cm$^{-1}$. Refractive indices for these films were measured by ellipsometry at 632.4 nm and the refractive indices ranged from 1.95–2.01 for these films. Silicon nitride films were characterized by Auger depth profile analysis. Silicon, carbon, nitrogen and oxygen content for these films were determined. The composition of silicon nitride was 43% silicon and 57% nitrogen. The composition of these films was uniform throughout the depth of the films. Oxygen and carbon were below the detection limits (<2 atomic %) of the auger spectroscopy.

Comparative data of several analogous precursors and the bis(tertiarybutylamino)silane of the present invention is set forth below in Table 2.

TABLE 2

| Precursors | Formula | Mol Wt | Vapor V. Press Torr | at T °C. | Source sccm | Temp °C. | Press mTorr | NH3/ source | Dep Rte ang/min | Refr index |
|---|---|---|---|---|---|---|---|---|---|---|
| Bis(dimethylamino)silane | $H_2Si(N[CH_3]_2)_2$ | 118.25 | >10 | 27 | | 600 | | | | |
| | | | | | 22.0 | 650 | 600 | 6.0 | 5.5 | 2.00 |
| Tris(dimethylamino)silane | $HSi(N[CH_3]_2)_3$ | 161.32 | 8 | 29 | 21.6 | 600 | 600 | 6.0 | 0 | |
| | | | | | 21.6 | 650 | 600 | 6.0 | 12 | 1.75 |
| | | | | | 21.6 | 700 | 600 | 6.0 | 22 | 1.89 |
| Bis(diethylamino)silane | $H_2Si(N[C_2H_5]_2)_2$ | 174.36 | 14 | 65.4 | 48.3 | 550 | 300 | 0 | 15 | 1.65 |
| | | | | | 38.6 | 600 | 500 | 0 | 16 | 2.00 |
| Bis(t-butylamino)silane | $H_2Si(NHC_4H_9)_2$ | 174.36 | 7.5 | 45 | 22.0 | 600 | 600 | 6.0 | 14 | 1.96 |
| | | | | | 22.0 | 650 | 600 | 6.0 | 58 | 1.95 |
| | | | | | 22.0 | 700 | 600 | 6.0 | 124 | 1.96 |
| Di-t-butyldiaminosilane | $(C_4H_9)_2Si(NH_2)_2$ | 174.36 | 2.1 | 39 | 21.0 | 600 | 600 | 6.3 | 12 | 1.87 |
| | | | | | 18.6 | 650 | 600 | 7.1 | 43 | 1.93 |
| | | | | | 26.0 | 650 | 600 | 5.1 | 57 | 1.94 |
| | | | | | 21.0 | 700 | 600 | 6.3 | 130 | 1.99 |
| Tris(ethylamino)ethylsilane | $C_2H_5Si(NHC_2H_5)_3$ | 189.38 | | 54 | 11.0 | 600 | 600 | 4.0 | 9 | 1.73 |
| | | | | | 11.0 | 650 | 600 | 4.0 | 30 | 1.87 |
| | | | | | 23.0 | 650 | 600 | 6.0 | 47 | 1.88 |

TABLE 2-continued

| Precursors | Formula | Mol Wt | Vapor V. Press Torr | at T °C. | Source sccm | Temp °C. | Press mTorr | NH3/ source | Dep Rte ang/min | Refr index |
|---|---|---|---|---|---|---|---|---|---|---|
|  |  |  |  |  | 11.0 | 700 | 600 | 4.0 | 62 | 1.93 |
|  |  |  |  |  | 23.0 | 700 | 600 | 6.0 | 105 | 1.94 |
| Tetrakis(dimethylamino)silane | Si(N[CH$_3$]$_2$)$_4$ | 204.39 | 7.3 | 51 | 34.3 | 600 | 500 | 0 | 0 |  |

Based upon this data, vapor pressure of the precursors for easy delivery, deposition rates, carbon impurities in the deposited films, temperature of deposition, silicon to nitrogen ratios and refractive indices were used as criteria to compare the different precursors. The highest deposition rates were obtained using chemicals that had N—H bonds; bis(tertiarybutylamino)silane, di-t-butyldiaminosilane, and tris(ethylamino)ethyl silane. Of these, the silicon nitride films having the lowest carbon impurities in the deposited films were obtained using chemicals that did not have direct Si—C bonds, namely; bis(tertiarybutylamino)silane and t-butylaminosilane dimer. The most uniform depositions were obtained using chemicals that had t-butyl groups, namely; bis(tertiarybutylamino)silane and di-t-butyidiaminosilane. In light of this criteria, bis(tertiarybutylamino)silane is unexpectedly a superior silicon nitride precursor.

The present invention has been described with regard to a preferred embodiment, however the full scope of the present invention should be ascertained from the claims which follow.

We claim:

1. A process for the low pressure chemical vapor deposition of silicon nitride on a substrate, comprising:
   providing a substrate;
   contacting ammonia and a silane of the formula (t-C$_4$H$_9$NH)$_2$SiH$_2$ to deposit silicon nitride on the substrate.

2. The process of claim 1 wherein the temperature of the substrate is in the range of approximately 500° to 800° C.

3. The process of claim 1 wherein the pressure is in the range of approximately 20 mTorr to 2 Torr.

4. The process of claim 1 wherein the molar ratio of ammonia to silane is greater than approximately 2:1.

5. The process of claim 1 wherein the substrate is silicon.

6. The process of claim 1 wherein the substrate is an electronic device.

7. The process of claim 1 wherein the substrate is a flat panel display.

8. A low temperature chemical vapor deposition of silicon nitride in a reaction zone, comprising the steps of:
   a) heating a substrate to a temperature in the range of approximately 500°–800° C. in said zone;
   b) maintaining the substrate in a vacuum at a pressure in the range of approximately 20 mTorr–2 Torr in said zone;
   c) introducing into said zone ammonia and a silane of the formula: (t-C$_4$H$_9$NH)$_2$SiH$_2$; and
   d) maintaining the conditions of a) through c) sufficient to cause a film of silicon nitride to deposit on the substrate.

* * * * *